(12) United States Patent
Dahan (10) Patent No.: US 7,415,493 B2
(45) Date of Patent: Aug. 19, 2008

(54) ASYNCHRONOUS SAMPLING RATE CONVERSION

(75) Inventor: Odi Dahan, Oranit (IL)

(73) Assignee: Freescale Semiconductor, Inc., Austin, TX (US)

( * ) Notice: Subject to any disclaimer, the term of this patent is extended or adjusted under 35 U.S.C. 154(b) by 704 days.

(21) Appl. No.: 10/508,619

(22) PCT Filed: Nov. 1, 2002

(86) PCT No.: PCT/EP02/12268

§ 371 (c)(1),
(2), (4) Date: Mar. 18, 2005

(87) PCT Pub. No.: WO03/081774

PCT Pub. Date: Oct. 2, 2003

(65) Prior Publication Data

US 2005/0156625 A1    Jul. 21, 2005

(30) Foreign Application Priority Data

Mar. 22, 2002    (GB) .................... 0206959.9

(51) Int. Cl.
*G06F 17/17* (2006.01)
(52) U.S. Cl. ...................................................... 708/313
(58) Field of Classification Search .................. 708/313
See application file for complete search history.

(56) References Cited

U.S. PATENT DOCUMENTS

| 4,797,845 | A | | 1/1989 | Stikvoort | |
| 5,600,379 | A | | 2/1997 | Wagner | |
| 6,141,671 | A | * | 10/2000 | Adams et al. | ................ 708/313 |
| 2005/0111540 | A1 | * | 5/2005 | Modrie et al. | ................ 375/232 |

* cited by examiner

*Primary Examiner*—David H Malzahn (57) ABSTRACT

An adaptive proportional integral control loop determines a ratio of the input sampling rate to the output sampling rate for use in asynchronous sample rate conversion. An input counter counts input samples and its output is sampled at the output sampling rate by a latch. The output of the latch is passed through a closed loop circuit comprising variable gain and integrator sections.

19 Claims, 8 Drawing Sheets

PRIOR ART

ASYNCHRONOUS SAMPLING RATE CONVERSION

This invention relates to asynchronous sampling rate conversion and particularly to apparatus for measuring a ratio between input and output sampling rates.

In certain applications of digital signal processing, there is a need to change the sampling rate of a signal, either decreasing it or increasing it by some amount. For example, in telecommunication systems which transmit and receive different types of signals (eg. facsimile, speech, video) there is a requirement to process the various signals at different rates depending on the corresponding bandwidths. The process of converting a signal from a given rate to a different rate is called sampling rate conversion. In applications where the input and output samples are controlled by independent clocks, the process is known as asynchronous sampling rate conversion. An overview of sampling rate conversion techniques can be found in "Digital Signal Processing" by J. Proakis and D. Manolakis, third edition, Prentice Hall, 1996.

To convert the sampling rate of a signal using an arbitrary sampling factor, the original analogue signal must be re-constructed and then re-sampled at the desired sampling rate. In the digital domain, a highly over-sampled signal can be used instead of the analogue signal. If the timing of all the output samples precisely matches the corresponding samples of the over-sampled signal, then no error will be produced.

In asynchronous sampling rate conversion, this is not the case because the clocks associated with the input and the output signals are asynchronous. Therefore, the timing of the output samples may never precisely match the corresponding samples of the over-sampled signal, no matter how high the over-sampling factor is. So the value of an output sample is taken from the nearest sample of the over-sampled signal. The values of the output samples in this case do not represent the exact time that they were taken, which is equivalent to introducing noise into the output signal. The higher the over-sampling factor is, the lower the noise introduced into the output signal. An over-sampling factor that attenuates this noise (spurious rejection) below a given noise floor can be found. The drawback of this method is that good spurious rejection can be achieved only if an extremely high over-sampling factor is used.

Some spurious rejection can also be achieved using much lower over-sampling factors if every two adjacent samples of the over-sampled signal are linearly interpolated to enable re-sampling at any arbitrary time point.

A totally equivalent approach is to apply an interpolation (polyphase) filter on the input signal whose coefficients are linearly interpolated. This kind of interpolation filter has, conceptually, a continuous, piece-wise linear impulse response.

Figure 1:
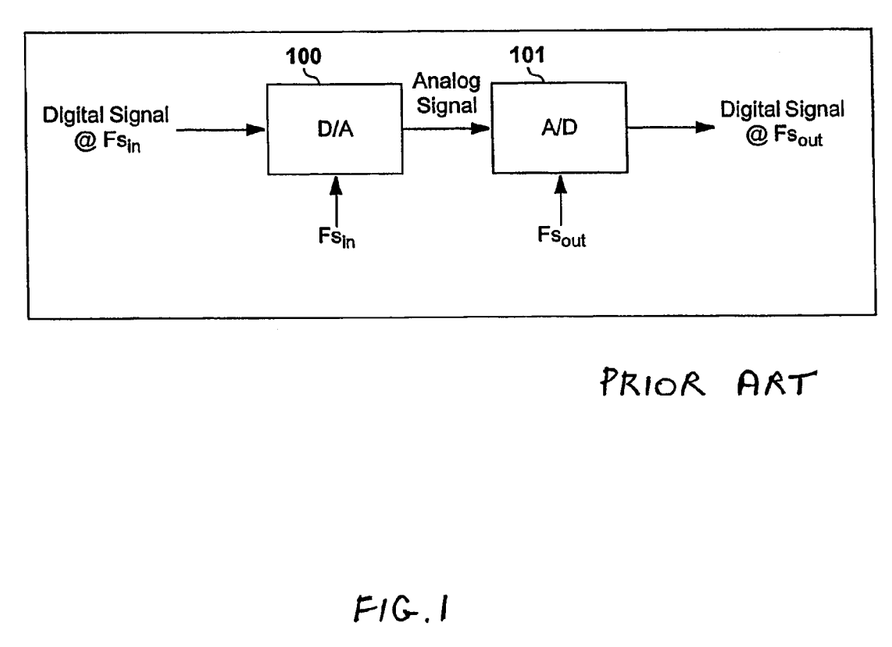
FIG. 1 is schematic block diagram illustrating a known technique for sampling rate conversion.

The most straightforward method to perform asynchronous sampling rate conversion is to convert the digital signal to analogue using a digital to analogue (D/A) converter 100, and then to resample the analogue signal at the new sampling rate using an analogue to digital (A/D) converter 101 (see FIG. 1).

Figure 2:
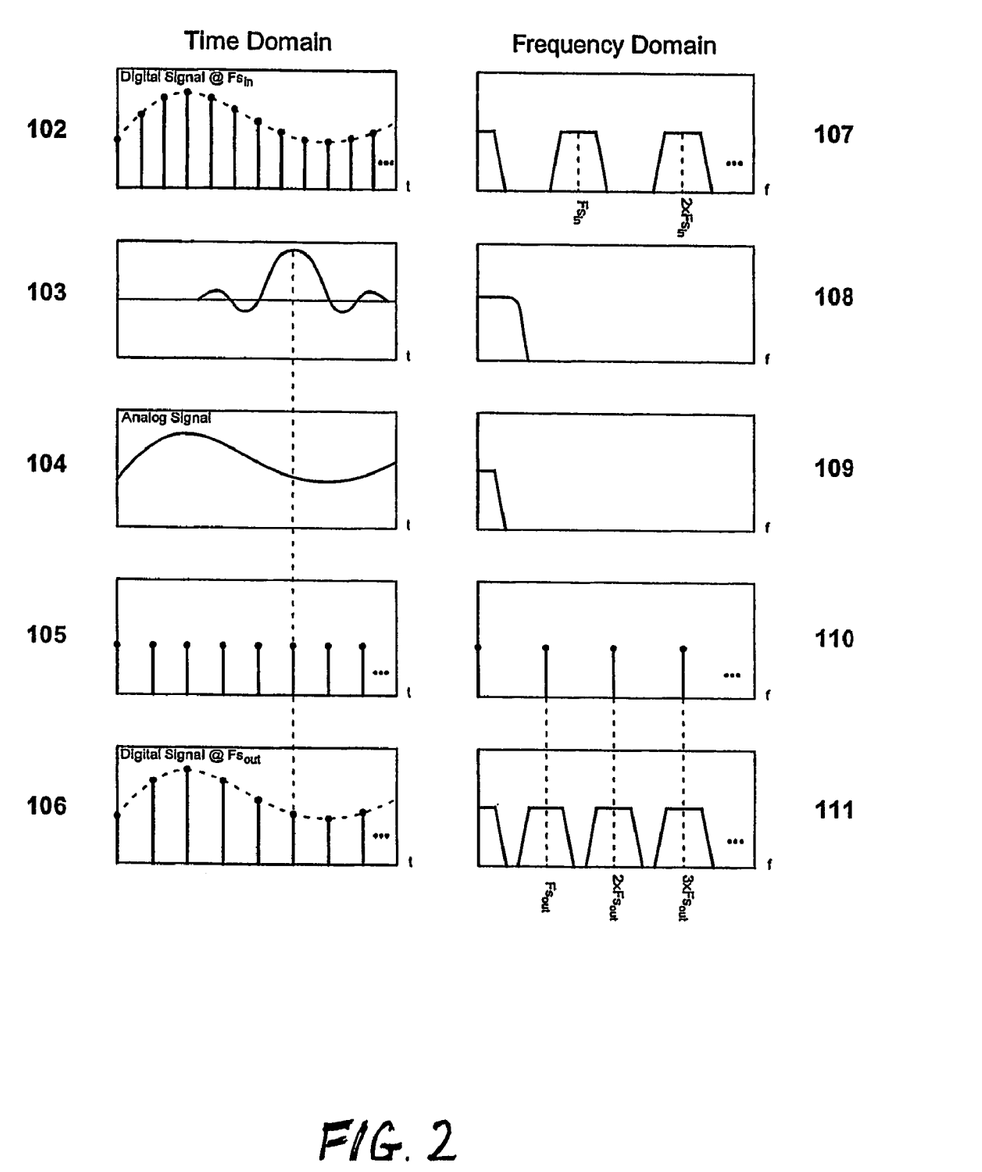
FIG. 2 shows graphical representations illustrating sampling rate conversion stages in a typical analogue sampling rate conversion process.

FIG. 2 shows the analog asynchronous sampling rate conversion stages both in the time domain and the frequency domain. In the time domain, the analogue asynchronous sampling rate conversion may be described as follows. The input digital signal 102 sampling rate is $Fs_{in}$. The input digital signal 102 is convolved with an analogue low pass filter impulse response 103 to reconstruct the original analogue signal 104. The analogue signal 104 is then multiplied by an impulse train 105 to result the output digital signal 106 sampled at $Fs_{out}$.

In the frequency domain, the analogue asynchronous sampling rate conversion may be described as follows. The spectrum of the input digital signal 107 is multiplied by the frequency response of an analogue low pass filter 108 to result the spectrum of the analogue signal 109. The spectrum of the analogue signal 109 is then convolved with an impulse train 110 to result the spectrum of the output digital signal 111.

Digital asynchronous sampling rate conversion theory is based on the analogue sample rate conversion concepts, with some modifications. When trying to project the analogue asynchronous sample rate conversion to the digital domain, the following problems arise:

1. The impulse response of the analogue low pass filter 103 is continuous in time, and therefore requires an infinite coefficients storage.
2. The reconstructed analogue signal 104 is also continuous, and therefore requires the calculation of infinite number of signal values.

The first problem can be solved by using a pseudo analogue filter which is a digital finite impulse response (FIR) filter whose coefficients are interpolated. The second problem is solved by calculating the output digital signal directly. Thus, all the signal values that are omitted during the resampling stage are not calculated in the first place.

Figure 3:
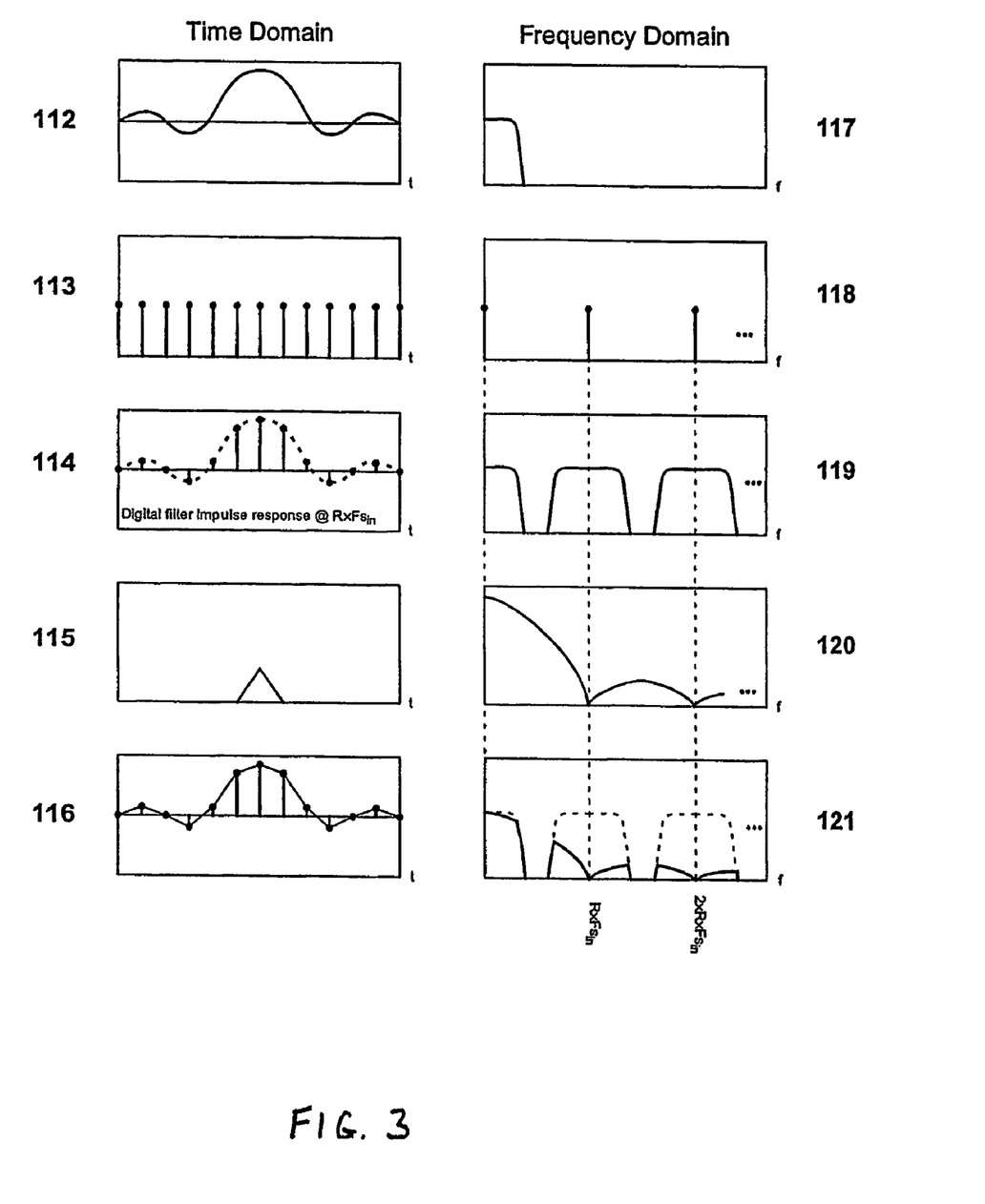
FIG. 3 shows graphical representations illustrating the design process of a known pseudo-analogue filter.

FIG. 3 shows the design process of the pseudo analogue filter, both in the time domain and the frequency domain. The impulse response of the analog filter 112 (same as 103) is multiplied by an impulse train 113 to sample it at $R \times Fs_{in}$, where R is defined as the oversampling factor. The multiplication product is a discrete impulse response 114. The samples of the discrete impulse response 114 are stored in a read only memory (ROM). The pseudo analogue impulse response 116 is a linear interpolation of the discrete impulse response. The pseudo analogue impulse response 116 can also be seen as the convolution of the discrete impulse response 114 with a two-samples wide triangular wave 115.

Various other interpolation methods can be used, such as third-order Lagrange, Hermite, second-order Osculating and B-Spline. Other interpolation methods may produce better assessment of the analogue impulse response, but at the price of higher computational complexity.

In the frequency domain, the pseudo analogue filter design may be seen as follows. The frequency response of the analogue filter 117 (same as 108) is convolved with an impulse train 118 to produce the spectrum of the discrete frequency response 119. The spectrum of the triangular wave 115 has the form of $sinc^2$ function 120. The frequency response of the pseudo analogue filter 121 is the product of the discrete frequency response 119 and a $sinc^2$ function 120.

Both in the time domain and the frequency domain it can be seen that the pseudo analogue filter is not an exact reproduction of the analogue filter. The frequency response of the pseudo analogue filter 121 contains two major distortions:

1. The spectrum centered around zero has the roll off of the $sinc^2$ main lobe.
2. The spectrum's images are not completely attenuated.

By increasing the oversampling factor R, the spectrum of the triangular wave 120 can be "stretched". The stretching decreases the $sinc^2$ roll off, and widens its notches. The wider the notches are, the stronger the attenuation of the images in the pseudo analogue frequency response 121 becomes (higher spurious rejection). The distortions caused by the linear interpolation can be reduced below any desirable level, simply by increasing the oversampling ratio, R. The disadvantage of large oversampling ratio, R, is the large ROM required to store the filter coefficients 114.

Figure 4:
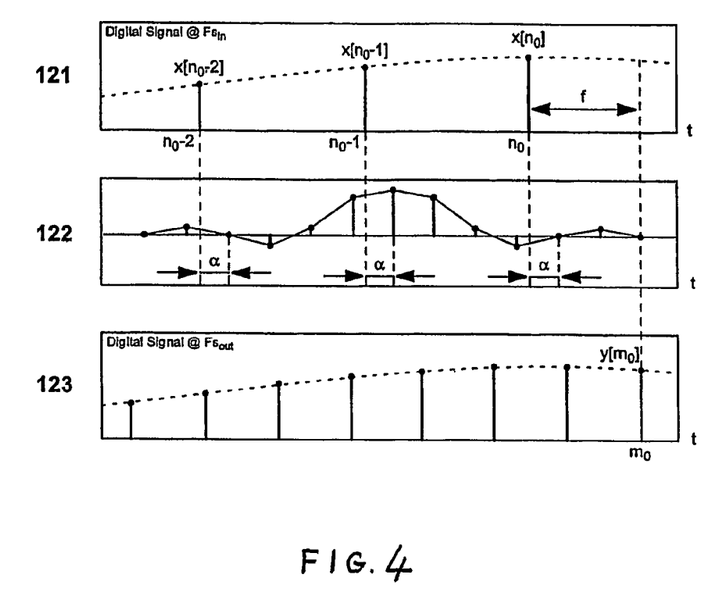
FIG. 4 shows graphical representations illustrating a typical digital sampling rate conversion algorithm.

FIG. 4 illustrates a typical digital sampling rate conversion algorithm. The input digital signal 121 is identical to signal 102, the impulse response of the pseudo analogue filter 122 is identical to signal 116 and the output digital signal 123 is identical to signal 106.

To calculate one output sample y[$m_0$], for example, the following steps need to be executed:

1. Identify the integer, $n_0$, which is the index of the last input sample, and the fraction, f, which is the phase between $m_0$ and $n_0$ in terms of the input signal's index. The left hand expression of Eq. 1.1 below is the time point of the desired output sample, in terms of the output signal's index. The right hand expression of Eq. 1.1 is the time point of the desired output sample, in terms of the input signal's index.

$$\frac{m_0}{Fs_{out}} = \frac{n_0 + f}{Fs_{in}} \qquad (1.1)$$

$$n_0 + f = \frac{Fs_{in}}{Fs_{out}} \cdot m_0 \qquad (1.2)$$

2. Align the last coefficient of the pseudo analogue filter with $m_0$ and calculate the relative phase between the impulse response 122 and the input digital signal 121. The relative phase is the fractional part of f.R.
3. For each sample in the input digital signal 121, that falls within the boundaries of the aligned impulse response 122, calculate the value of the impulse response 122, using linear interpolation. The relative phase is the weighting factor in the interpolation.
4. Multiply every input sample 121 by the corresponding interpolated value of the impulse response 122, and sum the products to obtain y[$m_0$].

As seen in Eq. 1.2 above, the digital asynchronous sample rate conversion incorporates a measurement of the actual ratio between the input and output sampling rates. Preferably, the ratio measurement should comply with the following requirements:

very high accuracy (to avoid spurious rejection degradation),
jitter rejection,
fast settling time,
self adjustment to slow variations in the input and the output sampling rates.

The first stage of a digital asynchronous sampling rate conversion (ie. step 1 above) is the most important and difficult part of any rate conversion algorithm since it involves the measurement of the temporary ratio between the input and the output sampling rates. A mechanism for performing this step with high accuracy and with a very fast settling time would be particularly advantageous.

The remaining steps 2-4 listed above are much more straightforward, and can be easily implemented in a digital signal processor (DSP) or in dedicated co-processor software.

According to a first aspect of the present invention there is provided sampling rate conversion apparatus for determining a ratio ($Fs_{in}/Fs_{out}$) of input sampling rate to output sampling rate, the apparatus including;

means for generating a first ramp signal of slope $Fs_{in}$,
means for sampling the first ramp signal at a rate $Fs_{out}$ to produce a second ramp signal,
and a closed loop control system having an input consisting of the difference between the second ramp signal and a feedback signal generated by the closed loop control system, whereby in a steady state, an output of the closed loop control system equals $Fs_{in}/Fs_{out}$.

The invention has the advantages of a fast settling time and good quantisation noise attenuation.

The closed loop control system may be implemented as a simple gain circuit with fixed gain. Alternatively, the gain circuit may be divided into two branches, each having a gain variable with time.

In a preferred embodiment, the closed loop control system includes an output integrator which produces outputs comprising an integer ($n_0$) which is the index of the last input sample, and a fraction (f) which relates to a phase difference between input and output samples. The outputs of the output integrator may be used to steer the coefficients of a polyphase filter comprising part of an asynchronous sampling rate converter.

In accordance with a second aspect of the present invention there is provided a method for determining a ratio ($Fs_{in}/Fs_{out}$) of input sampling rate to output sampling rate for use in sampling rate conversion, the method including the steps of:

generating a first ramp signal of slope $Fs_{in}$,
sampling the first ramp signal at a rate $Fs_{out}$ to produce a second ramp signal,
generating a steady state output equal to Fsin/Fsout by passing the second ramp signal through a closed loop control system.

Some embodiments of the invention will now be described, by way of example only, with reference to the drawings of which.

Figure 5:
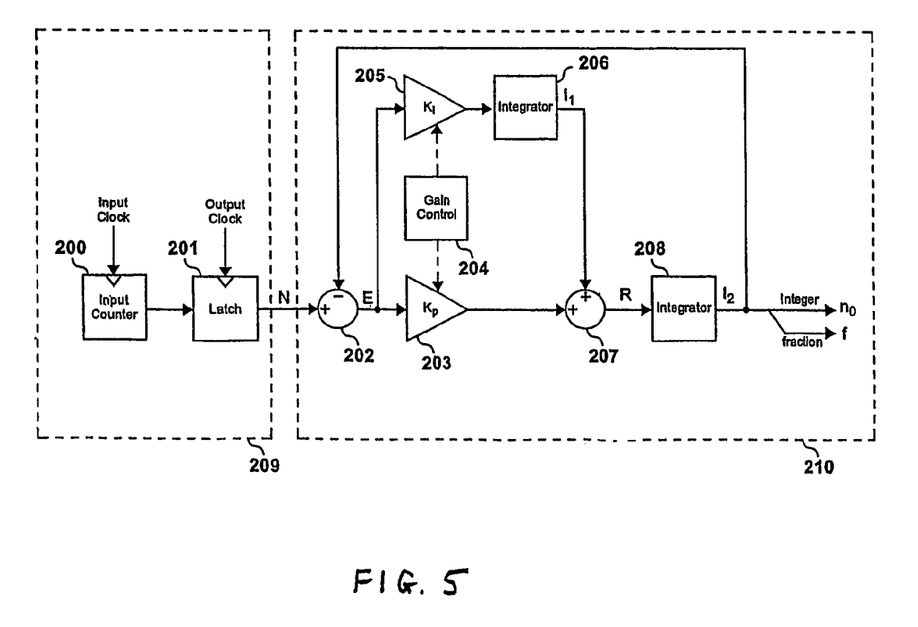
FIG. 5 is a block diagram of sampling rate conversion apparatus in accordance with the invention.
Figure 6:
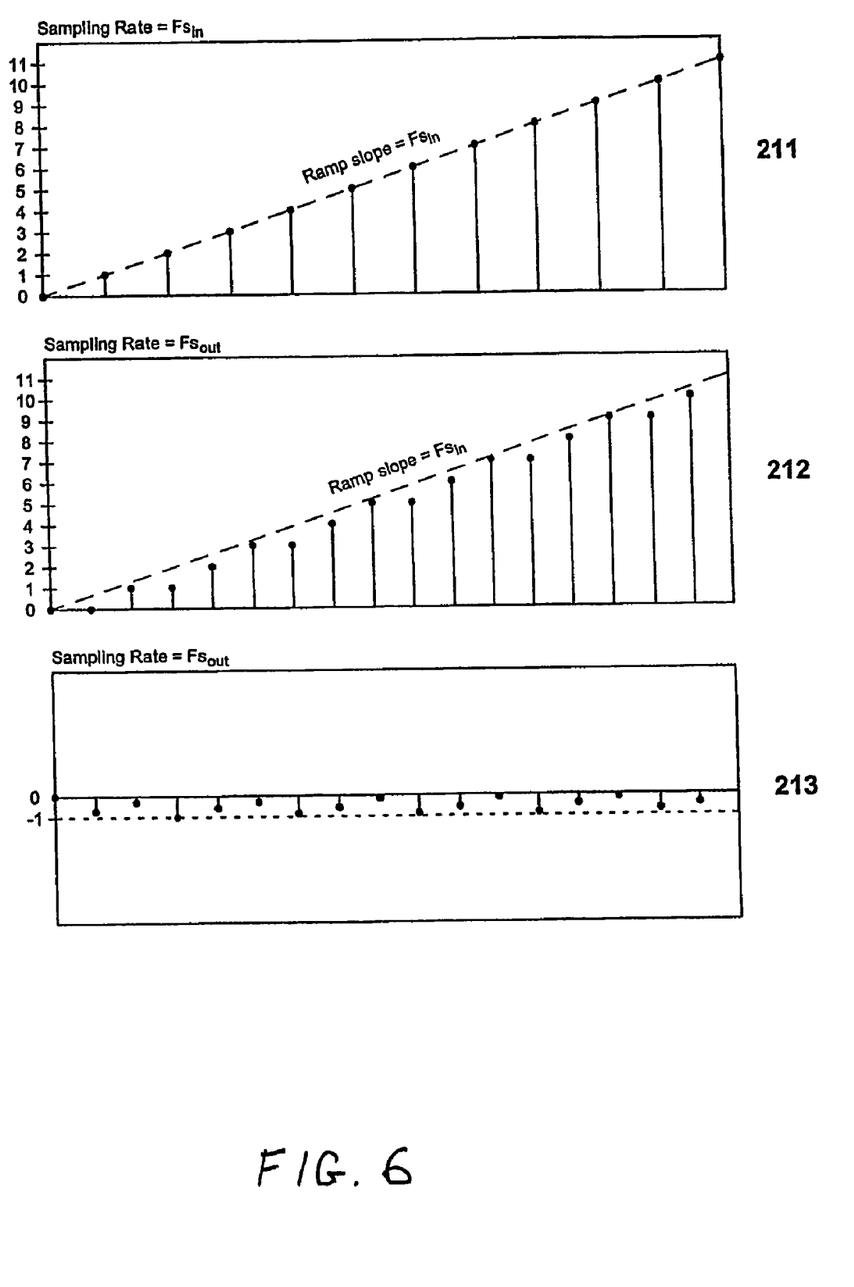
FIG. 6 shows graphical representations illustrating the operation of the sampling rate conversion apparatus of FIG. 5.

With reference to FIGS. 5 and 6, a specific embodiment of the invention consists of an Adaptive Proportional Integral Control Loop (APICL) having a first section 209, implemented in hardware, and a second section 210 implemented in software that can run on a DSP or a dedicated co-processor.

The APICL system shown in FIG. 5 has two clock inputs: input clock ($Fs_{in}$) and output clock ($Fs_{out}$). The APICL output is a real number whose integer part is $n_0$, and whose fractional part is f.

The input counter 200 counts the incoming samples, and its output may be seen as a ramp signal 211, sampled at $Fs_{in}$, whose slope equals to $Fs_{in}$. This ramp signal is sampled at $Fs_{out}$ by Latch 201 to allow all the processing from this point and on to be done at $Fs_{out}$. The output of Latch 201 is a ramp signal 212 whose average slope is also $Fs_{in}$, but the signal includes some quantisation noise 213. The quantisation noise value may get any value between 0 to −1, since the input to Latch 201 is always an integer and not a continuous ramp. In order to decrease the quantisation noise in the ramp, the output of latch 201 is fed into a closed loop as a control signal.

The output of the APICL is fed back to subtractor 202, where it is subtracted from the control signal. The output of subtractor 202 is defined as the error signal. The error signal is fed into two branches: proportional branch and integral branch. In the proportional branch the error signal is attenuated by attenuator 203. The gain of attenuator 203, $K_p$, is variable in time, and it is controlled by the gain control 204. In the Integral branch the error signal is attenuated by attenuator 205. The gain of attenuator 205, $K_i$, is also variable in time, and it is controlled by the gain control 204. The attenuated error signal in the integral branch is integrated by integrator 206 once every cycle of the output clock. The signals from the proportional and integral branches are summed in adder 207. The sum is fed to integrator 208, that integrates once every cycle of the output clock.

In steady state, the output of adder 207 is an accurate measurement of $Fs_{in}/Fs_{out}$. After $m_0$ output clock cycles, the output of integrator 208 may be represented by the right hand expression of Eq. 1.2. Thus, in steady state, the output of integrator 208 is a real number whose integer part is $n_0$, and its fractional part is f.

Considering the following three situations;
1. The value at integrator 208 input is smaller than $Fs_{in}/Fs_{out}$
2. The value at integrator 208 input is higher than $Fs_{in}/Fs_{out}$
3. The value at integrator 208 input is equal to $Fs_{in}/Fs_{out}$ In the first case, the slope of Integrator 208 output is smaller than the slope of the control signal. At a certain time point, the value of the control signal will exceed the value of Integrator 208 output. At this time point, the error signal will become positive and the value at integrator 208 input is will start to increase.

In the second case, the slope of Integrator 208 output is higher than the slope of the control signal. At a certain time point, the value of Integrator 208 output will exceed the value of the control signal. At this time point, the error signal will become negative and the value at integrator 208 input is will start to decrease.

In the third case, the slope of Integrator 208 output is equal to the slope of the control signal. This indicates a constant error signal. If the error is not zero, the loop will immediately return to one of the two states above until the error signal will decay to zero.

The three cases above show that in steady state, the value at integrator 208 input is equal to $Fs_{in}/Fs_{out}$ and the error signal equals to zero.

Choosing the appropriate values for $K_p$ and $K_i$ involves the following design considerations:
Accuracy—requires small $K_p$ to attenuate the quantization noise in the control signal.
Jitter rejection—requires small $K_p$ and $K_i$ to make the loop respond slowly.
Fast settling time—requires large $K_p$ and $K_i$ to make the loop respond quickly.
Self adjustment—requires large $K_p$ and $K_i$ to make the loop respond quickly.

Figure 7:
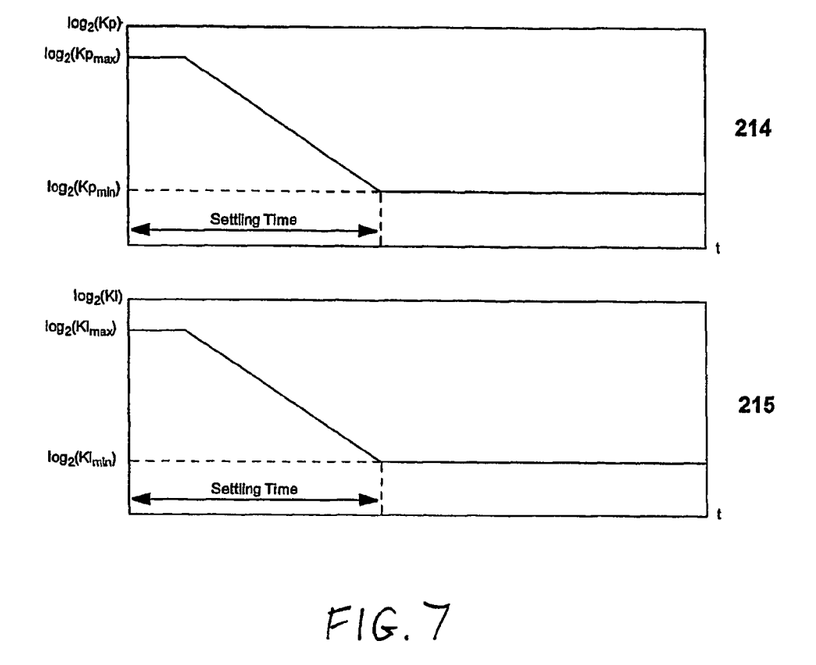
FIG. 7 is a graphical representation showing gain control of the sampling rate conversion apparatus of FIG. 5.

The gain control 204 mechanism is used to cope with these contradicting design considerations with minimal trade-off. Instead of using constant $K_p$ and $K_i$ the APICL incorporates variable gain. On start up, $K_p$ and $K_i$ are large to enable fast settling time. When the loop starts to settle, $K_p$ and $K_i$ are decreased gradually, up to a certain value. Simulations show that very good results are obtained when the gain control 204 decrease $K_p$ and $K_i$ exponentially, as illustrated in FIG. 7. The exponential decrement of $K_p$ and $K_i$ is achieved by multiplying $K_p$ and $K_i$ by a constant factor, b, once every cycle of the output clock.

Figure 8:
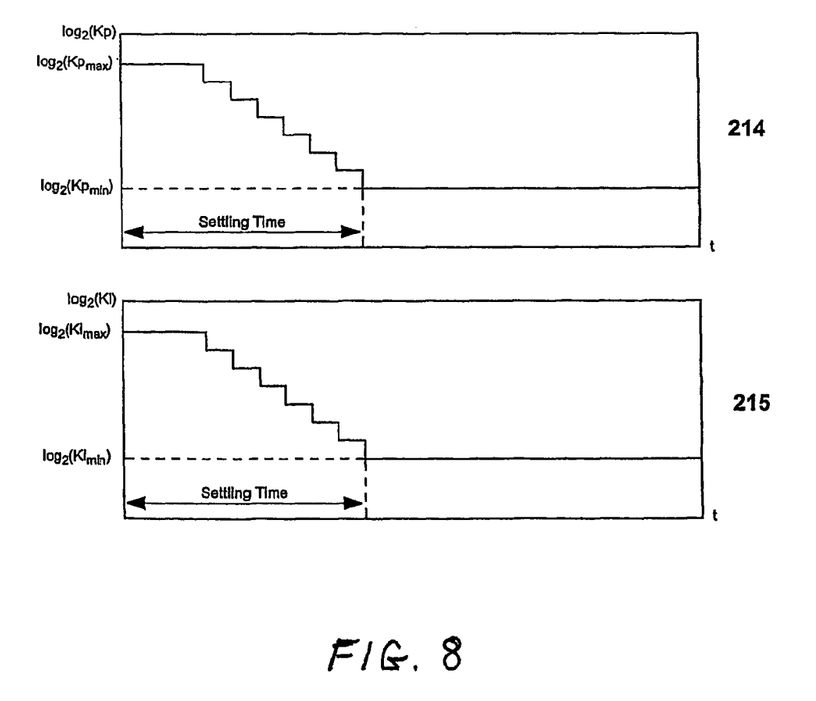
FIG. 8 is a further graphical representation showing gain control of the sampling rate conversion apparatus of FIG. 5.

If the multiplications need to be avoided, both $K_p$ and $K_i$ may take only $2^j$ values (j is integer). In such case, attenuators 203 and 205 only shift the bits of their input signal (see FIG. 8).

Simulations show that the loop settles gracefully in less than 5 ms, which is an excellent result comparing to known asynchronous sampling rate converters that settle in hundreds of milliseconds.

Figure 9:
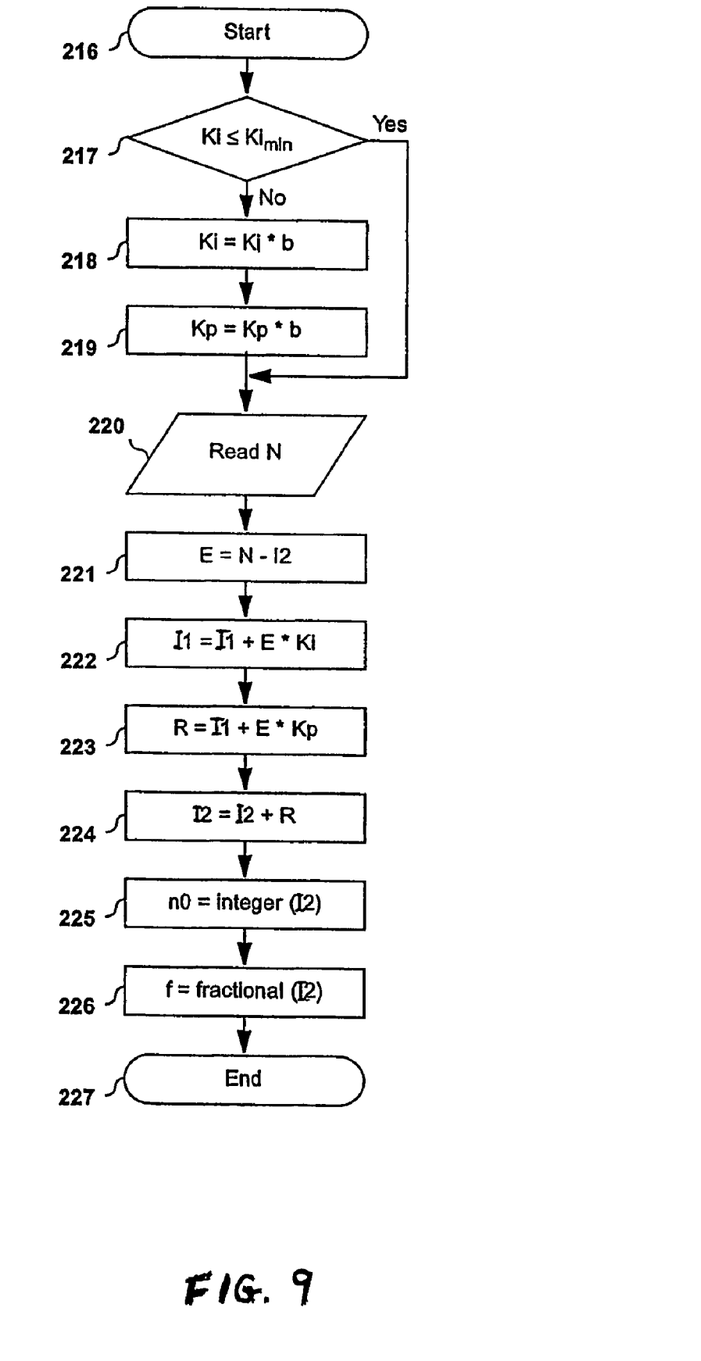
FIG. 9 is a flow chart illustrating the operation of the sampling rate conversion apparatus of FIG. 5.

FIG. 9 shows a flowchart of the steps that implement the function of the first part of the APICL. Every rising edge of the output clock, the routine starting at step 216 is executed.

At step 217, a decision is taken as to whether $K_i$ is below or equal to a minimum value ($K_i$min) or above it. If $K_i$ is not less than or equal to $K_i$min, then adjustments are made both to $K_i$ and $K_p$ by multiplying them both by the factor b. (Steps 218 and 219).

At step 220, a current value for N is read from the output of the latch 201 and fed into the subtracter 202.

At step 221, an error signal E is produced by the subtractor 202 by subtracting the output $I_2$ of the integrator 208 from N.

At step 222, the output of the integrator 206 is computed by adding the value $E.K_i$ to the previous $I_1$ value.

At step 223, the value R is computed by adding the value $I_1$ to the value $E.K_p$.

At step 224, a new $I_2$ value is determined by adding R to the previous value of $I_2$.

Finally, at steps 225 and 226, the integration process in integrator 208 results in outputs $n_0$ and f.

Figure 10:
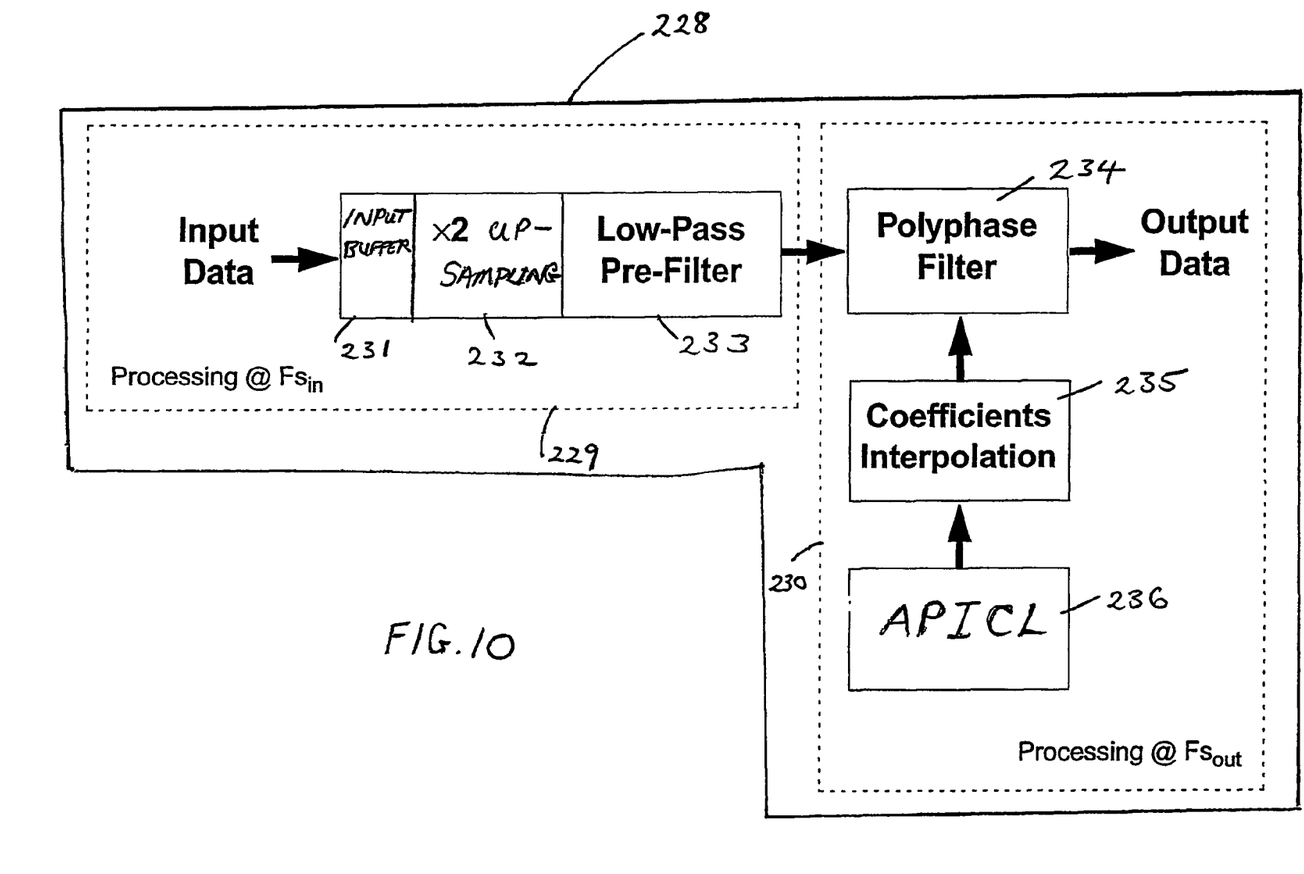
FIG. 10 is a block diagram showing the integration of the sampling rate conversion apparatus of FIG. 5 in an asynchronous sampling rate converter.

With reference to FIG. 10, the APICL is shown integrated into an asynchronous sampling rate converter 228. A first part 229 of the asynchronous sample rate converter 228 processes data at the input sampling rate $Fs_{in}$ and a second part 230 processes data at the output sampling rate $Fs_{out}$.

The first part 229 comprises an input buffer 231 and a×2 up-sampling module 232 whose output is fed to a low pass pre-filter 233. An output of the low pass pre-filter 233 is fed to an input of a polyphase filter 234 which, along with a co-efficients interpolation module 235 and the APICL 236, comprises said second part.

As the APICL 236 measures the (temporary) ratio between input and output sampling rates, this measurement enables the asynchronous sampling rate converter 228 to keep track of the phase relationship between input data and output data and to steer the poly phase filter coefficients accordingly.

In particular, the integer part no of the APICL output is used to calculate pointers to the input data buffer 231 and the fractional part f is used by the co-efficients interpolation module 235 to calculate the polyphase filter co-efficients.

The pre-filter tasks are executed once every input clock cycle. The polyphase filter tasks, coefficients interpolation and APICL tasks are executed once every output clock cycle.

The invention claimed is:

1. Sampling rate conversion apparatus for determining a ratio ($Fs_{in}/Fs_{out}$) of input sampling rate to output sampling rate, the apparatus including:
   means for generating a first ramp signal of slope $Fs_{in}$,
   means for sampling the first ramp signal at a rate $Fs_{out}$ to produce a second ramp signal, and a closed loop control system having an input consisting of the difference between the second ramp signal and a feedback signal generated by the closed loop control system, whereby in a steady state, an output of the closed loop control system equals $Fs_{in}/Fs_{out}$.

2. Sampling rate conversion apparatus as claimed in claim 1 in which the closed loop control system includes a fixed gain circuit.

3. Sampling rate conversion apparatus as claimed in claim 1 in which the closed loop control system includes two branches, each branch having a gain variable with time.

4. Sampling rate conversion apparatus as claimed in claim 3 in which a first branch of said two branches includes an integrator and in which the apparatus further includes a summer for summing outputs of each branch.

5. Sampling rate conversion apparatus as claimed in claim 1 in which the closed loop control system includes an output integrator.

6. Sampling rate conversion apparatus as claimed in claim 1 wherein the means for generating a first ramp signal comprises a counter having a clock input signal $Fs_{in}$.

7. Sampling rate conversion apparatus as claimed in claim 1 wherein the means for providing the second ramp signal comprises a latch clocked at a rate $Fs_{out}$.

8. A sampling rate converter including the apparatus of claim 1.

9. A method for determining a ratio ($Fs_{in}/Fs_{out}$) of input sampling rate to output sampling rate for use in sampling rate conversion, the method including the steps of:

generating a first ramp signal of slope $Fs_{in}$, sampling the first ramp signal at a rate $Fs_{out}$ to produce a second ramp signal, generating a steady state output equal to $Fs_{in}/Fs_{out}$ by passing the second ramp signal through a closed loop control system.

10. A method according to claim 8 further including the steps of passing the second ramp signal through a gain circuit and subtracting a feedback signal generated by the gain circuit from the second ramp signal.

11. A method according to claim 10 further including the steps of passing the second ramp signal through first and second branches of a gain circuit, summing an integrated output of the first branch with an output of the second branch to produce a summed output, integrating the summed output to produce an integrated output and subtracting the integrated output from the second ramp signal.

12. A method according to claim 11 further including the step of adjusting a gain of each branch of the gain circuit at a rate equal to the output sampling rate.

13. Sampling rate conversion apparatus for determining a ratio ($Fs_{in}/Fs_{out}$) of input sampling rate to output sampling rate, the apparatus including:

circuit for generating a first ramp signal of slope $Fs_{in}$, circuit for sampling the first ramp signal at a rate $Fs_{out}$ to produce a second ramp signal, and a closed loop control system having an input consisting of the difference between the second ramp signal and a feedback signal generated by the closed loop control system, whereby in a steady state, an output of the closed loop control system equals $Fs_{in}/Fs_{out}$.

14. Sampling rate conversion apparatus as claimed in claim 13 in which the closed loop control system includes a fixed gain circuit.

15. Sampling rate conversion apparatus as claimed in claim 13 in which the closed loop control system includes two branches, each branch having a gain variable with time.

16. Sampling rate conversion apparatus as claimed in claim 15 in which a first branch of said two branches includes an integrator and in which the apparatus further includes a summer for summing outputs of each branch.

17. Sampling rate conversion apparatus as claimed in claim 13 in which the closed loop control system includes an output integrator.

18. Sampling rate conversion apparatus as claimed in claim 13 wherein the circuit for generating a first ramp signal comprises a counter having a clock input signal $Fs_{in}$.

19. Sampling rate conversion apparatus as claimed in claim 13 wherein the circuit for providing the second ramp signal comprises a latch clocked at a rate $Fs_{out}$.

* * * * *